(12) United States Patent
Challa et al.

(10) Patent No.: US 10,461,720 B2
(45) Date of Patent: Oct. 29, 2019

(54) ACOUSTIC FILTER

(71) Applicant: SnapTrack, Inc., San Diego, CA (US)

(72) Inventors: Ravi Kiran Challa, San Diego, CA (US); Akshaya Ishwarayya Hiremath, San Diego, CA (US); Attieh Shahvarpour, Escondido, CA (US)

(73) Assignee: SnapTrack, Inc., San Diego, CA (US)

( * ) Notice: Subject to any disclaimer, the term of this patent is extended or adjusted under 35 U.S.C. 154(b) by 148 days.

(21) Appl. No.: 15/711,155

(22) Filed: Sep. 21, 2017

(65) Prior Publication Data

US 2019/0089324 A1 Mar. 21, 2019

(51) Int. Cl.
*H03H 9/64* (2006.01)
*H03H 9/145* (2006.01)
*H03H 9/00* (2006.01)
*H03H 9/25* (2006.01)
*H03H 9/02* (2006.01)

(52) U.S. Cl.
CPC .......... *H03H 9/643* (2013.01); *H03H 9/0047* (2013.01); *H03H 9/02637* (2013.01); *H03H 9/14555* (2013.01); *H03H 9/14582* (2013.01); *H03H 9/25* (2013.01); *H03H 9/6433* (2013.01); *H03H 9/6436* (2013.01); *H03H 9/6466* (2013.01)

(58) Field of Classification Search
CPC .. H03H 9/0047; H03H 9/02637; H03H 9/643; H03H 9/25; H03H 9/14555; H03H 9/6433

USPC ...................... 333/133, 193–196; 310/313 D
See application file for complete search history.

(56) References Cited

U.S. PATENT DOCUMENTS

| 6,420,946 | B1 | 7/2002 | Bauer et al. |
| 6,781,485 | B2 | 8/2004 | Takamine et al. |
| 6,894,588 | B2 | 5/2005 | Detlefsen |
| 6,972,643 | B2 | 12/2005 | Tsunekawa et al. |
| 7,042,132 | B2 | 5/2006 | Bauer et al. |
| 8,289,106 | B2 | 10/2012 | Kuroda et al. |
| 2004/0207491 | A1* | 10/2004 | Nakaya ............... H03H 9/0038 333/195 |
| 2016/0056791 | A1 | 2/2016 | Shimizu et al. |

OTHER PUBLICATIONS

Aref T., et al., "Quantum Acoustics with Surface Acoustic Waves", Mesoscale and Nanoscale Physics, arXiv:1506.01631v1 [cond-mat.mes-hall], Jun. 4, 2015, pp. 1-4.

* cited by examiner

*Primary Examiner* — Robert J Pascal
*Assistant Examiner* — Jorge L Salazar, Jr.
(74) *Attorney, Agent, or Firm* — Colby Nipper/Qualcomm

(57) ABSTRACT

Techniques are disclosed for increasing capacitance, decreasing losses, and/or improving a quality factor of a SAW filter. The techniques include using a partial-IDT instead of a reflector between two groups of IDTs. The partial-IDT is implemented having a cavity transition on a first end and a reflector transition on a second end. The cavity transition facilitates propagation of main-resonance acoustic waves into, or between elements of, the partial-IDT. The reflector transition facilitates reflection of main-resonance acoustic waves.

30 Claims, 11 Drawing Sheets

ACOUSTIC FILTER

TECHNICAL FIELD

This disclosure relates generally to acoustic resonators and, more specifically, surface acoustic wave resonators.

BACKGROUND

Acoustic resonators (also called "acoustic filters") can be used for filtering high-frequency signal waves. Using a piezoelectric material as a vibrating medium, acoustic resonators operate by transforming an electrical signal wave that is propagating along an electrical conductor into an acoustic signal wave that is propagating via the piezoelectric material. The acoustic signal wave propagates at a velocity having a magnitude that is significantly less than that of the propagation velocity of the electrical signal wave. Generally, the magnitude of the propagation velocity of a signal wave is proportional to a size of a wavelength of the signal wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as cellular phones and smart watches.

Surface acoustic wave ("SAW") filters (also called "SAW resonators") are a type of acoustic resonator that includes a system of two groups of inter-digital transducers ("IDTs"), with each of the two groups arranged between reflection gratings (also called "reflectors"). Each IDT includes a first bus bar (also called a "rail") coupled to either an input terminal or an output terminal, and a second bus bar, spaced from the first bus bar, connected to ground. The first bus bar couples together a first set of fingers extending from the first bus bar toward the second bus bar. The second bus bar couples together a second set of fingers extending from the second bus bar toward the first bus bar such that the second set of fingers extend between fingers of the first set of fingers. An overlap of the first set of fingers and the second set of fingers functions as multiple capacitors providing electric fields across a surface of the piezoelectric material. The length of the overlap is called the aperture of the IDT. The electric fields provided by the overlap cause the piezoelectric material to vibrate with a frequency based at least in part on a distance between each finger extending from the first bus bar and adjacent fingers extending from the second bus bar. This distance between fingers of an IDT is called a pitch. The frequency at which the piezoelectric material vibrates is a self-resonance (also called a "main-resonance") frequency of the IDT. An additional resonance is formed from a cavity resonance based in part on a distance between adjacent IDTs and chirping regions of the adjacent IDTs.

Desirable qualities of a SAW filter include a high quality factor to indicate effective selectivity of a desired frequency, low energy loss, and a small chip-footprint. Conventional SAW filters use chirping between IDTs to decrease acoustic losses, and thus increase a quality factor. Additionally, chirping is used to facilitate a smooth transition between IDTs of the SAW filter, improving filtering accuracy. Chirping is facilitated by arranging fingers of an IDT, generally those at a longitudinal end of the IDT, at a pitch that varies from the main region of the IDT. More interfaces between chirped regions of adjacent IDTs generally increase a quality factor of the SAW filter. Examples of chirping configurations are described in U.S. Pat. Nos. 6,420,946, 7,042,132, 6,894,588, and 6,972,643, which are incorporated herein by reference.

Conventional SAW filters may also have an increased aperture to increase a capacitance of the SAW filter, and thus reduce acoustic energy losses during operation. However, increasing an aperture of the SAW filter also increases insertion energy losses and increases a chip-footprint of the SAW filter.

This background provides context for the disclosure. Unless otherwise indicated, material described in this section is not prior art to the claims in this disclosure and is not admitted to be prior art by inclusion in this section.

SUMMARY

Techniques are disclosed for improving SAW filters by improving quality factors and decreasing energy losses of the SAW filters. These described techniques provide a partial-IDT between a first group of IDTs and a second group of IDTs. The partial-IDT includes a first bus bar coupling a first set of fingers and a second bus bar coupling a second set of fingers. The first bus bar may be electrically floating or may be coupled to an input terminal. However, if the first bus bar is coupled to the input terminal, the second bus bar is not coupled to ground, thus ensuring that the partial-IDT is a floating IDT. Furthermore, the first group of IDTs and the second group of IDTs may be coupled to an input terminal such that a main-resonance acoustic wave of the first group of IDTs is configured to be in-phase with a main-resonance acoustic wave of the second group of IDTS.

In an example aspect, a SAW filter includes a piezoelectric material having a first group of IDTs on the piezoelectric material. The first group of IDTs are configured to transform a first set of electrical signals into a first set of acoustic signals for propagation via a first portion of the piezoelectric material. The first group of IDTs is also configured to select a first set of selected acoustic signals of the first set of acoustic signals within a specified passband, and convert the first set of selected acoustic signals into a first set of filtered electrical signals. The SAW filter also includes a second group of IDTs on the piezoelectric material. The second group of IDTs are configured to transform a second set of electrical signals into a second set of acoustic signals for propagation via a second portion of the piezoelectric material. The second group of IDTs is also configured to select a second set of selected acoustic signals of the second set of acoustic signals within the specified passband and convert the second set of selected acoustic signals into a second set of filtered electrical signals. The SAW filter further includes a partial-IDT on the piezoelectric material and positioned between the first group of IDTs and the second group of IDTs. The partial IDT includes a first bus bar and a second bus bar that are uncoupled from ground such that the partial-IDT is electrically floating. The partial IDT includes a first side configured to facilitate a cavity transition between the partial-IDT and the first group of IDTs such that the cavity transition facilitates propagation of the first set of acoustic signals within, or between elements of, the partial-IDT. The partial-IDT further includes a second side configured to facilitate a reflector transition between the partial-IDT and the second group of IDTs such that the reflector transition reduces propagation of the second set of acoustic signals within, or between elements of, the partial-IDT.

In another example aspect, a SAW filter has a first longitudinal end and a second longitudinal end. The SAW filter includes a piezoelectric material having a first reflector on the piezoelectric material and at the first longitudinal end of the SAW filter with the first reflector configured to reflect acoustic waves within the SAW filter. The SAW filter also includes a first group of IDTs on the piezoelectric material and adjacent to the first reflector. The first group of IDTs includes a first input IDT coupled to an input terminal with the first input IDT configured to receive a first input electric signal and propagate a first set of acoustic signals via a first portion of the piezoelectric material. The first group of IDTs also includes a first output IDT coupled to an output terminal with the first output IDT configured to receive at least a portion of the first set of acoustic signals and propagate a first output electric signal to the output terminal. The SAW filter also includes a partial-IDT that is electrically floating on the piezoelectric material and adjacent to the first group of IDTs. The partial-IDT includes a first bus bar and a second bus bar, at least one of which being uncoupled from ground. The partial-IDT is also spaced from the first group of IDTs at a cavity distance to facilitate propagation of the first set of acoustic signals from the first group of IDTs within, or between elements of, the partial-IDT. The SAW filter further includes a second group of IDTs on the piezoelectric material, adjacent to the partial-IDT. The second group of IDTs includes a second input IDT coupled to the input terminal with the second input IDT configured to receive a second input electric signal and propagate a second set of acoustic signals via a second portion of the piezoelectric material. The second group of IDTs also includes a second output IDT coupled to the output terminal with the second output IDT configured to receive at least a portion of the second set of acoustic signals and propagate a second output electric signal to the output terminal. The second group of IDTs is spaced from the partial-IDT at a reflector distance to reduce propagation of the second set of acoustic signals from the second group of IDTs within, or between elements of, the partial-IDT. The SAW resonator additionally includes a second reflector on the piezoelectric material and at the second longitudinal end with the second reflector adjacent to the second group of IDTs and configured to reflect the second set of acoustic signals toward the second input IDT.

In another example aspect, a SAW filter includes a piezoelectric material with a first reflector on the piezoelectric material and a second reflector on the piezoelectric material. The first reflector and the second reflector define a first longitudinal end of the SAW filter and a second longitudinal end of the SAW filter, respectively. The SAW filter also includes a series of IDTs on the piezoelectric material arranged between the first reflector and the second reflector. The SAW filter further includes a partial-IDT that is electrically floating on the piezoelectric material and positioned between, and defining, a first group of the series of IDTs and a second group of the series of IDTs. The partial-IDT facilitates a cavity transition between the partial-IDT and the first group and a reflector transition between the partial-IDT and the second group.

In another example aspect, a SAW filter includes a piezoelectric material having a first reflector and a second reflector on the piezoelectric material and defining longitudinal ends of the SAW filter. The SAW filter also includes a first group of IDTs on the piezoelectric material with the first group of IDTs configured to transform a first set of electrical signals into a first set of acoustic signals for propagation via a first portion of the piezoelectric material. The first group of IDT is also configured to select a first set of selected acoustic signals of the first set of acoustic signals within a specified passband, and convert the first set of selected acoustic signals into a first set of filtered electrical signals. The SAW filter further includes a second group of IDTs on the piezoelectric material with the second group of IDTs configured to transform a second set of electrical signals into a second set of acoustic signals for propagation via a second portion of the piezoelectric material. The second group of IDTs is also configured to select a second set of selected acoustic signals of the second set of acoustic signals within the specified passband, and convert the second set of selected acoustic signals into a second set of filtered electrical signals The SAW filter additionally includes an element for reducing propagation of the first set of acoustic signals within the second portion of the piezoelectric material and reducing propagation of the second set of acoustic signals within the first portion of the piezoelectric material. The element includes a means for providing a cavity transition between the element and the first group of IDTs with the cavity transition being effective to facilitate propagation of at least a portion of the first set of acoustic signals through the element. The element also includes a means for providing a reflector transition between the element and the second group of IDTs with the reflector transition being effective to reduce propagation of the second set of acoustic signals through the element.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Figure 1:
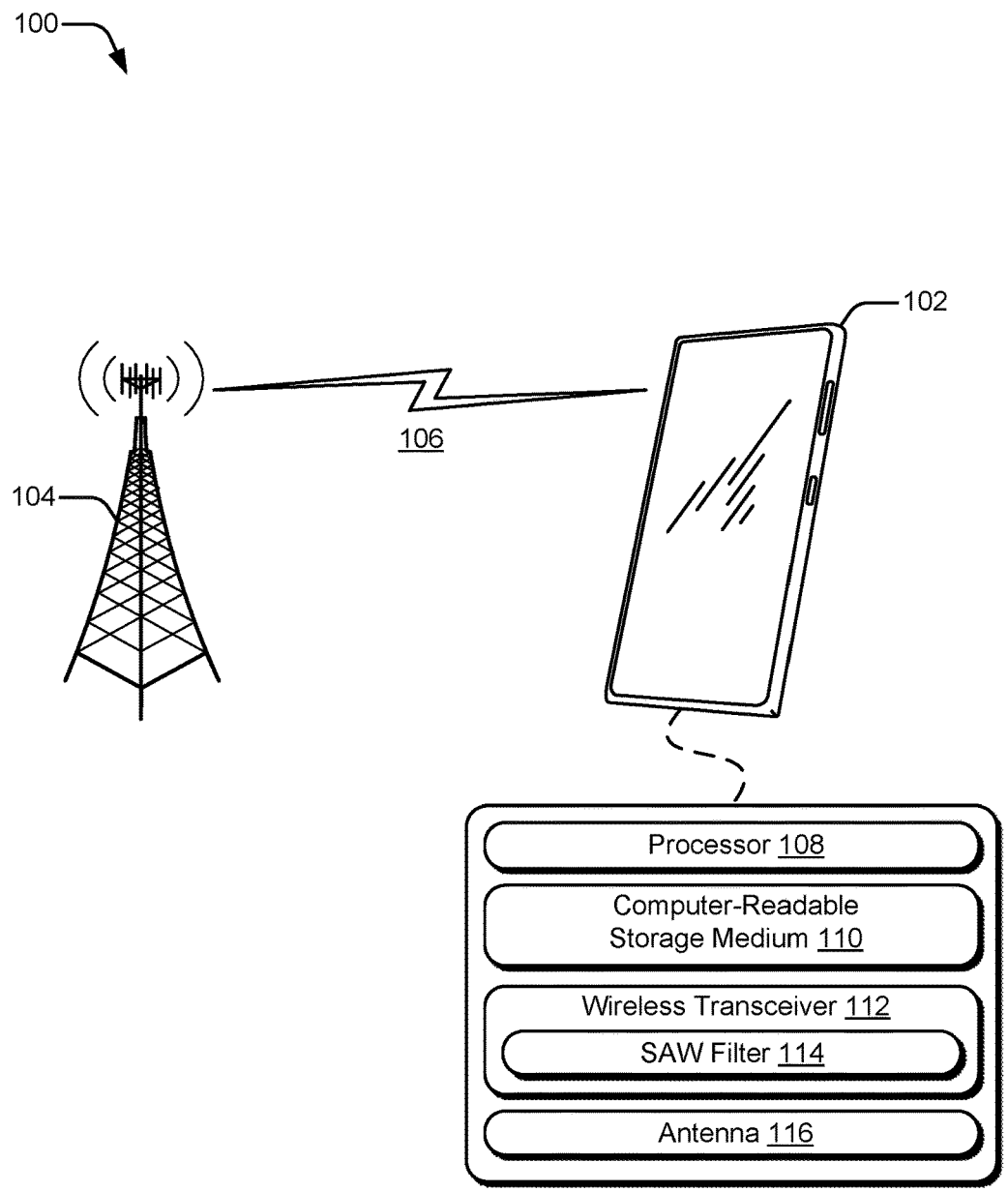
FIG. 1 is an illustration of an example environment for receiving and filtering a wireless signal according to one or more implementations.

Conventional SAW filters use a configuration including a reflector between two groups of IDTs to prevent leaking between the two groups of IDTs. The reflector consumes valuable space of the SAW filter without increasing a capacitance of the SAW filter or providing a chirping interface. However, reflection of surface waves between two groups of IDTs is important to reduce interference between the two groups of IDTs, which would decrease a quality factor of the SAW filter.

This document describes example structures and techniques to increase capacitance, decrease losses, and improve a quality factor of a SAW filter. The techniques include using a partial-IDT instead of a reflector between two groups of IDTs. The partial-IDT is implemented having a cavity transition on a first end and a reflector transition on a second end. The cavity transition facilitates propagation of main-resonance acoustic waves into, or between elements of, the partial-IDT. The reflector transition facilitates reflection of main-resonance acoustic waves. The cavity transition may be formed by positioning the partial-IDT at a cavity-transition distance from an adjacent IDT and/or providing a chirping region to facilitate propagation of main-resonance acoustic waves from a direction of the adjacent IDT. The main-resonance acoustic waves are thus permitted to propagate within, or between elements of, the partial-IDT.

The reflector transition may be formed by positioning the partial-IDT at a reflector distance from another adjacent IDT and/providing a chirping region to reduce propagation of main-resonance acoustic waves within, or between elements of, the partial-IDT. The reflector transition also causes reflection of main-resonance acoustic waves back toward the other adjacent IDT to reduce energy loss from leaking.

The partial-IDT may be coupled at a first bus bar to an input terminal configured to provide a signal to the two groups of IDTs, coupled to an input terminal not carrying the signal, or uncoupled from inputs. The partial-IDT is uncoupled from inputs and ground at a second bus bar. Furthermore, the two groups of IDTs are configured to receive the signal in-phase with each other, and thus, the second bus bar is not a virtual ground for the two groups of IDTs.

The partial-IDT also adds to a capacitance of the SAW filter, which allows for a reduction of an aperture of the SAW filter without a net loss in capacitance. A reduction of the aperture of the SAW filter reduces losses, such as insertion losses, and thus improves a quality factor of the SAW filter. Furthermore, the cavity transition facilitates a chirping interface between the partial-IDT and an adjacent group of IDTs, thus also improving a quality factor of the SAW filter.

In the following discussion, an example environment is first described that may employ the techniques described herein. Example devices and configurations are then described, which may be performed in the example environment as well as other environments. Consequently, example devices and configurations are not limited to the example environment and the example environment is not limited to the example devices and configurations. Features described in relation to one example implementation may be combined with features described in relation to one or more other example implementations.

Example Environment

FIG. 1 illustrates an example environment 100, which includes a computing device 102 that communicates with a base station 104 through a wireless communication link 106 (wireless link 106). One or more described implementations for filtering a wireless signal can be realized in the example environment 100. In the example environment 100, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiberoptic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and/or an uplink of other data or control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, BLUETOOTH, and so forth.

The computing device 102 includes a processor 108 and a computer-readable storage medium 110 (CRM 110). The processor 108 may include any type of processor, such as an application processor or multi-core processor that is configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions, data, and other information of the computing device 102, and thus does not include transitory propagating signals or carrier waves.

A wireless transceiver 112 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 112 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 112 enables the computing device 102 to communicate with the base station 104 and networks connected therewith.

The wireless transceiver 112 includes at least one surface acoustic wave (SAW) filter 114 for filtering signals received or transmitted via the wireless link 106. The SAW filter 114 may be, for example, an element of a duplexer used for filtering during transmitting and receiving data and/or signals via an antenna 116. In a receiving operation, the antenna 116 receives multiple signals transmitted via one or more wireless networks. The multiple signals includes signals having various frequencies and intended for various devices. The antenna 116 is coupled to the duplexer including the SAW filter 114 to perform filtering of the multiple signals. The SAW filter 114 may select signals within a specified passband and reject frequencies outside of the passband. The selected signals are then passed, via an output terminal of the SAW filter 114, to another component of the computing device 102 for further processing.

Figure 2:
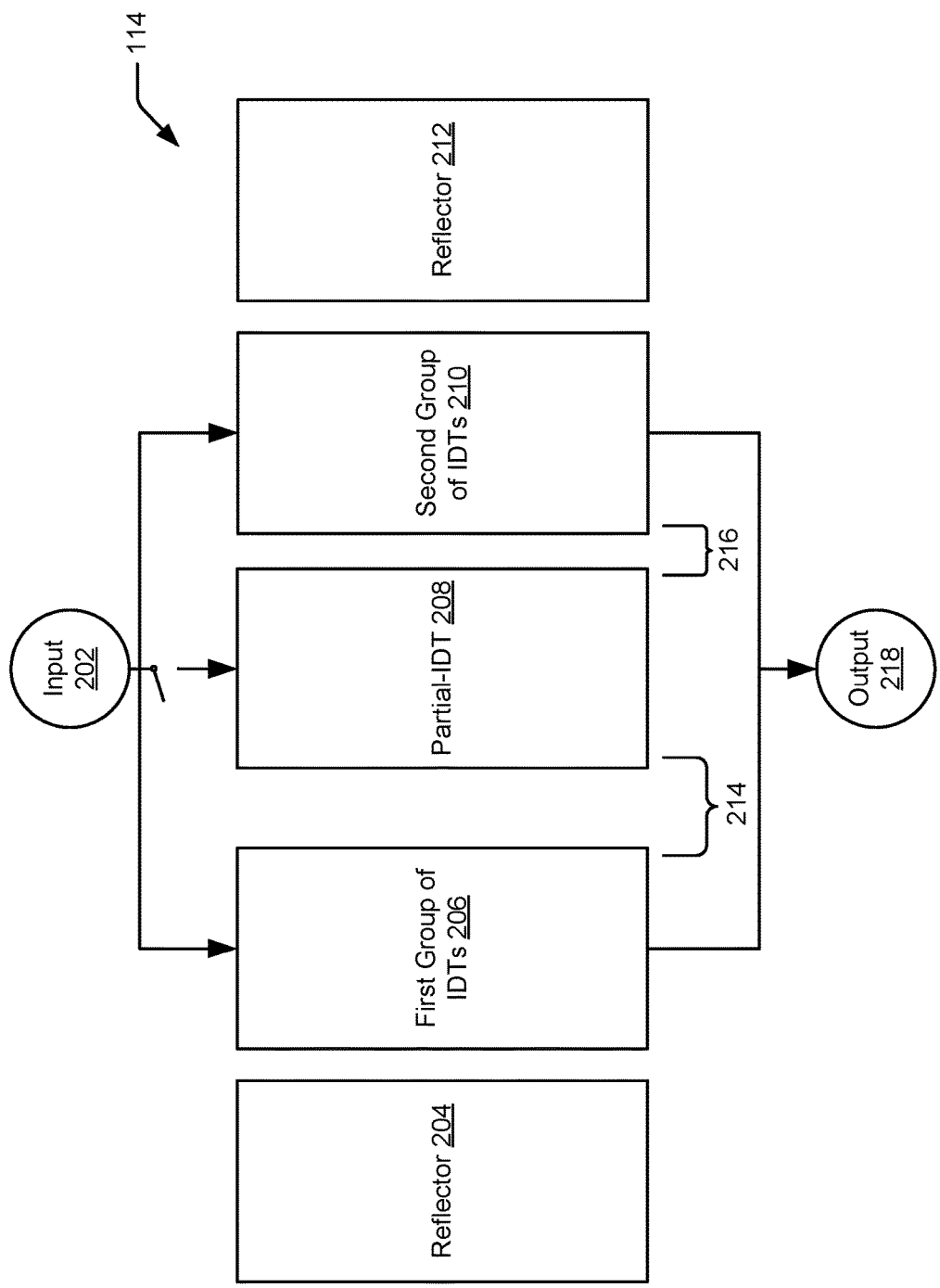
FIG. 2 is a schematic diagram of an example configuration of a SAW filter according to one or more implementations.

FIG. 2 is a schematic diagram of an example SAW filter 114 for filtering signals and selecting signals within a specified passband. The SAW filter 114 is coupled to an input terminal 202 ("Input") for receiving electrical signals for filtering. The input terminal 202 may be coupled to an antenna or other signal-receiving device. In other implementations, the input terminal 202 is coupled to a signal generator of the computing device 102 before transmitting to another device. The SAW filter 114 includes a reflector 204, a first group of inter-digital transducers (IDTs) 206, a partial-IDT 208, a second group of IDTs 210 and a reflector 212. An interface between the first group of IDTs 206 and the partial-IDT 208 form a cavity transition 214. An interface between the partial-IDT 208 and the second group of IDTs 210 form a reflector transition 214. The SAW filter 114 is coupled to an output terminal 218 ("Output") for providing a filtered portion of the electrical signals received via the input terminal 202.

The first group of IDTs 206 and the second group of IDTs 210 are configured to transform a first set of electrical signals received via the input terminal 202 into a set of corresponding acoustic signals, select acoustic signals of the set of corresponding acoustic signals within the specified passband, and convert the selected acoustic signals into a set of filtered electrical signals. To facilitate this description, the reflector 204 is referenced as defining a first longitudinal end and the reflector 212 is referenced as defining a second longitudinal end of the SAW filter 114. During the transforming of the electrical signals into corresponding acoustic signals, the first group of IDTs 206 and the second group of IDTs 210 generate acoustic waves that carry acoustic signals both longitudinal directions (e.g., toward the reflector 204 and toward the reflector 212) along the SAW filter 114. The reflectors 204 and 212 are configured to reflect acoustic waves, including those having a frequency within the specified passband, back toward the first group of IDTs 206 and the second group of IDTs 210 to reduce energy losses from escaping acoustic waves.

The cavity transition 214 (also called an "IDT transition") may be dimensioned based on one or more of a cavity distance between the partial-IDT 208 and the first group of IDTs 206, a chirping region of the first group of IDTs 206, and a chirping region of the partial-IDT 208. The cavity distance may be, for example, between $n \times \lambda + \lambda/4$ and $n \times \lambda + \lambda/2$, where $\lambda$ is a wavelength of a main-resonance acoustic wave generated by the first group of IDTs 206 and n is a whole number. More specifically, the cavity distance may be between $0.3 \times \lambda$ and $0.4 \times \lambda$. Still more specifically, the cavity distance may be about $0.32 \times \lambda$. The cavity transition 214 facilitates propagation of main-resonance acoustic waves (also called "self-resonance waves") generated by the first group of IDTs 206 within, or between elements of, the partial-IDT 208.

The reflector transition 216 may be provided based on one or more of a reflector distance between the partial-IDT 208 and the second group of IDTs 210, a chirping region of the partial-IDT 208, and a chirping region of the second group of IDTs 210. The reflector distance may be, for example, between $n \times \lambda$ and $n \times \lambda + \lambda/4$, where $\lambda$ is a wavelength of a main-resonance acoustic wave generated by the second group of IDTs 206 and n is a whole number. More specifically, the reflector distance may be between $0.05 \times \lambda$ and $0.15 \times \lambda$. Still more specifically, the reflector distance may be about $0.09 \times \lambda$. The reflector transition 216 reduces propagation of main-resonance acoustic waves generated by the second group of IDTs 210 within, or between elements of, the partial-IDT 208. Additionally, the reflector transition may increase reflection of the main-resonance acoustic waves generated by the second group of IDTs 210 such that the reflected waves are directed back toward the second group of IDTs 210.

By allowing the main-resonance acoustic waves generated by the first group of IDTs 206 to propagate within, or between elements of, the partial-IDT 208, a chirping interface may be formed between the first group of IDTs 206 and the partial-IDT 208, thus improving a quality factor of the SAW filter 114. Additionally, permitting the main-resonance acoustic waves generated by the first group of IDTs 206 to propagate through, within, or between elements of the partial-IDT 208 may increase a capacitance of the SAW filter 114. Because of the increased capacitance based on the propagation of the main-resonance acoustic waves of the first group of IDTs 206, an aperture of the SAW filter 114 may be reduced, thus reducing energy loss of the SAW filter 114 and reducing a chip-footprint of the SAW filter 114.

Figure 3:
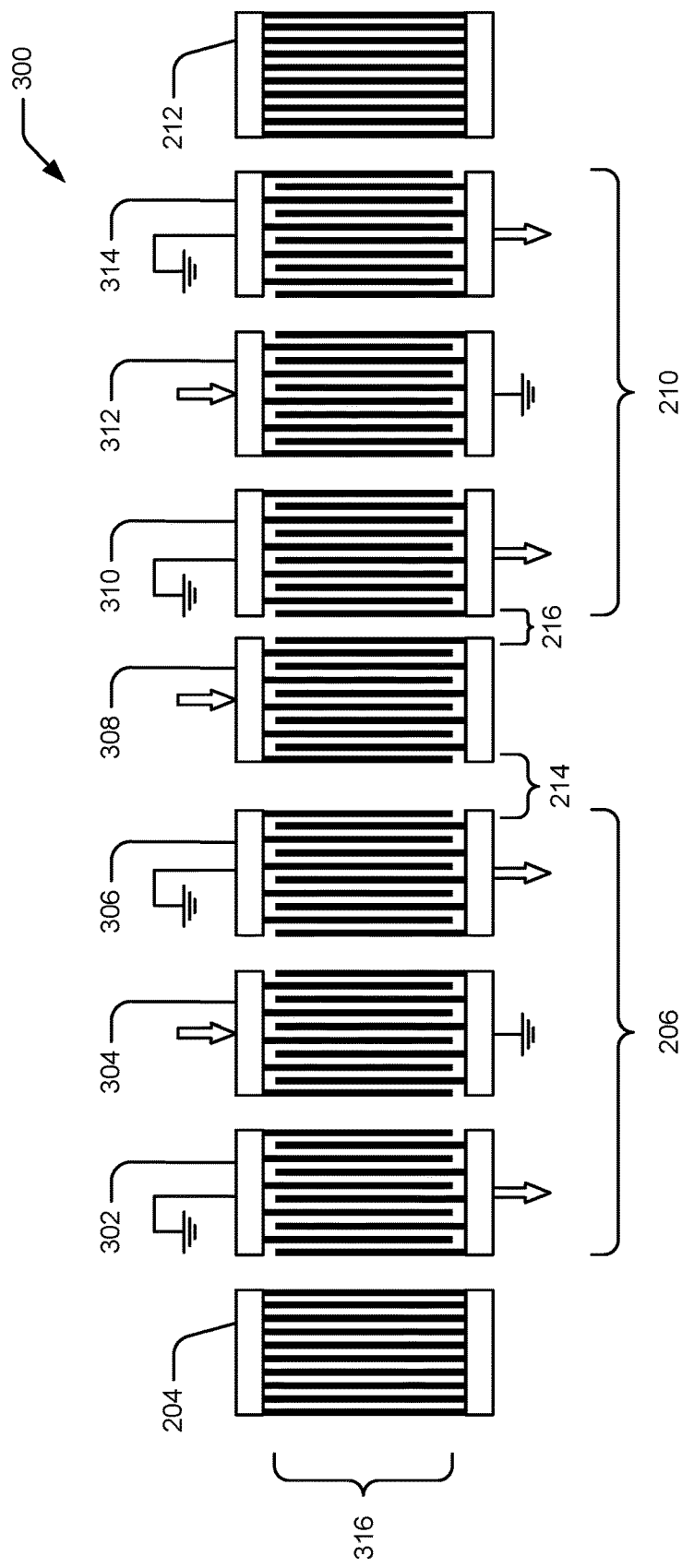
FIG. 3 is an illustration of another example configuration of a SAW filter according to one or more implementations.

FIG. 3 illustrates another example configuration 300 of the SAW filter 114 in detail. The example configuration 300 includes the reflector 204 at a first longitudinal end and adjacent to the first group of IDTs 206. The first group of IDTs 206 includes IDTs 302, 304, and 306. A partial-IDT 308 divides the series of IDTs 302, 304, 306, 310, 312, and 314 to define the first group of IDTs 206 and the second group of IDTs 210. The partial-IDT 308 provides the cavity transition 214 with the first group of IDTs 206 and provides a reflector transition 216 with the second group of IDTs 210. As illustrated, a cavity distance of the cavity transition 214 is greater than the reflector distance of the reflector transition 216. In some implementations, the partial-IDT 308 instead provides a reflector transition 216 with the first group of IDTs 206 and a cavity transition 214 with the second group of IDTs 210.

The configuration of the respective IDTs 302, 306, 310, and 314 is referred to as an output IDT because each includes a respective grounded bus bar and a respective output bus bar. The configuration of the IDTs 304 and 312 is referred to as an input IDT because each includes a respective input bus bar and a respective grounded bus bar. Alternative implementations instead include four input IDTs and two output IDTs. For example, a first output IDT may be positioned between two input IDTs of the first group of IDTs 206 and a second output IDT may be positioned between two input IDTs of the second group of IDTs 210.

The bus bars of the respective IDTs 302, 304, 306, 310, 312, and 314 couple finger elements extending laterally toward the other bus bar of the respective IDTs (shown from a bottom toward a top or from the top toward the bottom of the IDT). The fingers extending from a first bus bar of an IDT overlap with fingers extending from a second bus bar of the IDT in a lateral length referred to as an aperture of the IDT. The aperture of the example configuration 300 is a distance 316. Apertures of the IDTs 302, 304, 306, 310, 312, and 314 are shown as being about equal, however, they may be different. Furthermore, an individual IDT may have a variable aperture at various regions of the individual IDT. Additionally, an aperture of the SAW filter 114 may be less than an aperture of a conventional SAW filter because of an increased capacitance of the SAW filter 114 caused by introducing the partial-IDT 308 in place of a reflector of a conventional SAW filter. For example, in comparison to a conventional SAW filter aperture, an aperture of the SAW filter 114 may be reduced by about 15% without sacrificing capacitance. By reducing the aperture, the SAW filter 114 has a lower insertion energy loss when compared to a conventional SAW filter.

Each of the IDTs 302, 304, 306, 310, 312, and 314 may have various quantities of fingers. For example, the IDTs 302 and 306 may each have a quantity of n fingers, and the IDT 304 may have a quantity of 2×n fingers. Similarly, the IDTs 310 and 314 may each have a quantity of about m fingers, and the IDT 312 may have a quantity of about 2×m fingers. Additionally or alternatively, IDTs 302 and 314 may each have a same quantity of fingers, IDTs 304 and 312 may each have a same quantity of fingers, and IDTs 306 and 310 may each have a same quantity of fingers. Alternatively, IDTs 302 and 310 may each have a quantity of about x fingers, IDTs 304 and 312 may each have a quantity of about y fingers, and IDTs 306 and 314 may each have a quantity of about z fingers. The partial-IDT may have about a same quantity of fingers as one or more of IDTs 302, 304, 306, 310, 312, or 314.

The partial-IDT 308 includes a first bus bar coupled to an input and a second bus bar that is floating. Because the partial-IDT 308 does not include a grounded bus bar, the partial-IDT 308 does not generate a main-resonance acoustic wave to propagate out of the partial-IDT 308. Instead, the partial-IDT 308 merely increases a capacitance of the SAW filter 114 by adding charged fingers that interact with fingers of adjacent IDTs 306 and 310. In alternative implementations, the first bus bar and the second bus bar of the partial-IDT 308 are both floating. The partial-IDT 308 may instead include a first bus bar and a second bus bar that are both grounded. Furthermore, the partial-IDT 308 may instead include a first bus bar and a second bus bar that are both coupled to the input. The first bus bar may be coupled to an input voltage that does not include the input signal as provided to the input IDTs.

Figure 4:
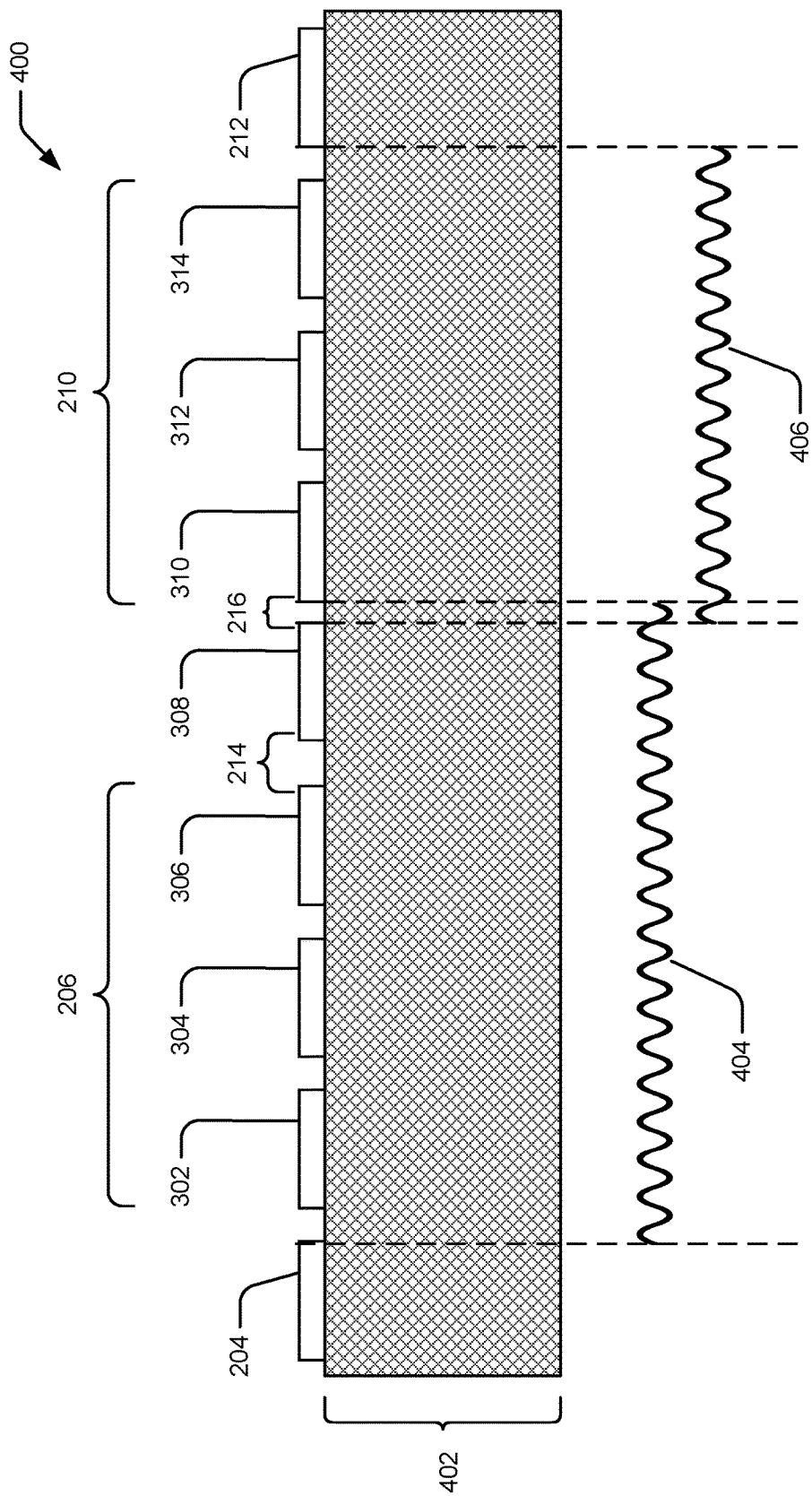
FIG. 4 is an illustration of a side view of the example configuration of the SAW filter of FIG. 3.

FIG. 4 illustrates a side view of an example configuration 400 of the configuration 300 shown in FIG. 3. The reflectors 204 and 212, the first group of IDTs 206, the partial-IDT 308, and the second group of IDTs 210 are shown on an upper surface of a piezoelectric material 402 (also called a "piezoelectric substrate"). The piezoelectric material 402 is a material that produces a mechanical strain when an electric field is applied. More specifically, the piezoelectric material 402 is deformed to produce surface waves in response to an electric field generated between fingers of the IDTs 302, 304, 306, 310, 312, and 314. The surface waves propagate along the upper surface of the piezoelectric material 402. The piezoelectric material 402 may include aluminum nitride, quartz crystal, gallium orthophosphate, or lithium-based material. Furthermore, the piezoelectric material 402 may be doped, sized, and/or cut at various angles to modify propagation, coupling, or other material characteristics.

The first group of IDTs 206 are calibrated with the reflector 204, the partial-IDT 308, the cavity transition 214, and the reflector transition 216 to facilitate a propagation region 404 of waves having a frequency within the specified passband. These waves are generated by interaction between the piezoelectric material 402 and the input IDT 304 of the first group of IDTs 206 as main-resonance-frequency waves or chirped-frequency waves. These waves are propagated along the upper surface of the piezoelectric material 402 until they are reflected by the reflector 204, coupled to the output IDTs 302 or 306, or reflected based on the reflector transition 216 between the partial-IDT 308 and the IDT 310. The second group of IDTs 210 are calibrated with the reflector 212, the partial-IDT 308, and a reflector transition 216 to facilitate a propagation region 406 of waves having a frequency within another specified passband. The other specified passband may a same passband as the specified passband of the first group of IDTs 206. These waves are generated by the input IDT 312 of the second group of IDTs 210 and propagated along the upper surface of the piezoelectric material 402 until they are reflected by the reflector 212, coupled to the output IDTs 310 or 314, or reflected based on the reflector transition between the partial-IDT 308 and the IDT 310.

Figure 5:
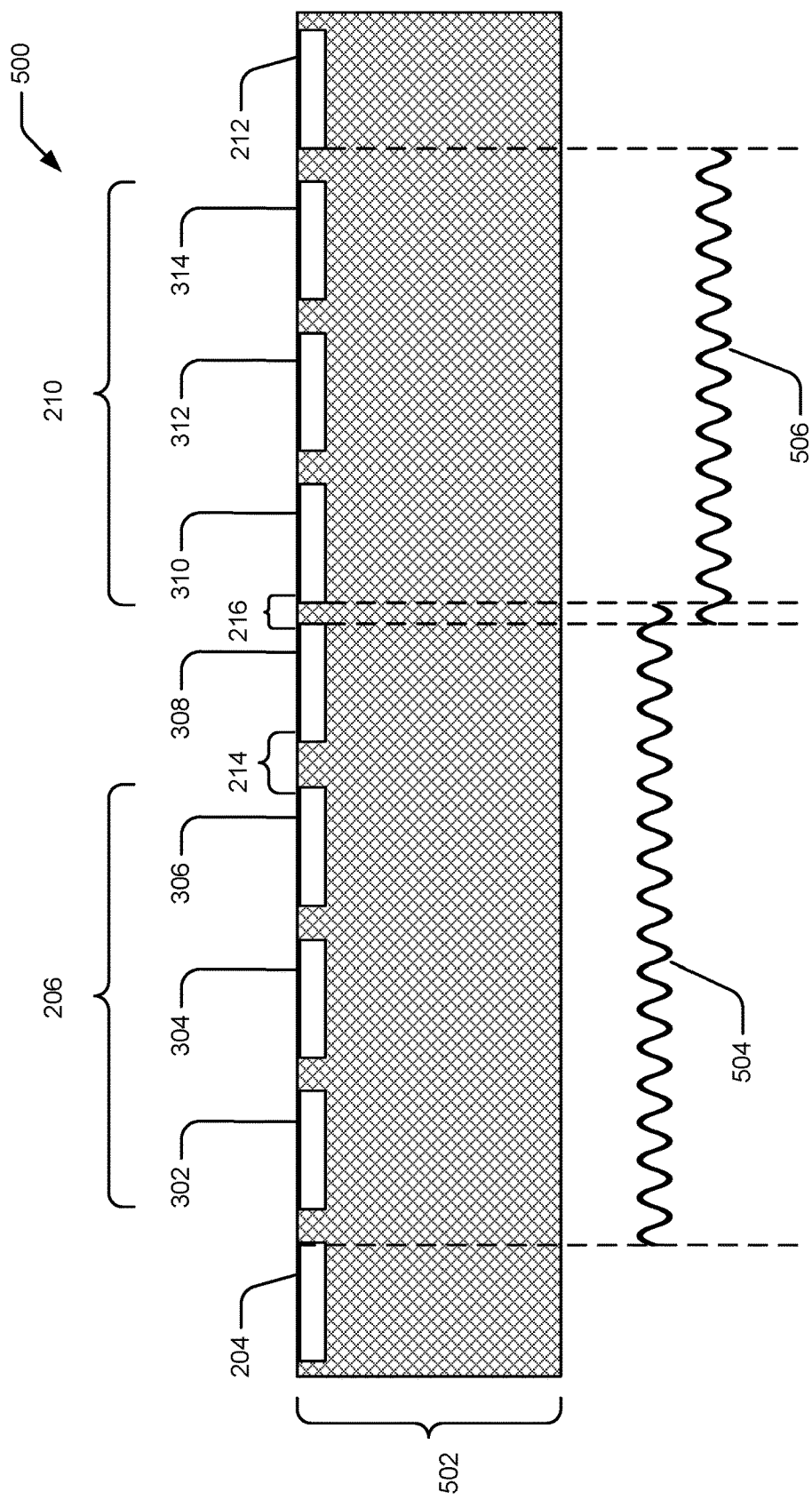
FIG. 5 is an illustration of a side view of another example configuration of a SAW filter according to one or more implementations.

FIG. 5 illustrates a side view of another configuration 500 of the configuration 300 shown in FIG. 3. The reflectors 204 and 212, the first group of IDTs 206, the partial-IDT 308, and the second group of IDTs 210 are shown embedded into an upper surface of a piezoelectric material 502. In the configuration 500, the piezoelectric material 502 at least partially fills volumes of space between the reflectors 204 and 212, the IDTs 302, 304, 306, 310, 312, and 314, and the partial-IDT 308. Additionally, the piezoelectric material 502 may at least partially fill volumes of space between fingers of the reflectors 204 and 212, the IDTs 302, 304, 306, 310, 312, 314, and the partial-IDT 308.

Electric fields produced between fingers of the input IDTs 304 and 312 generate surface waves on an upper surface of the piezoelectric material 502. During propagation, the surface waves may physically raise and lower fingers of the IDTs 302, 304, 306, 310, 312, and 314 and the partial-IDT 308. The first group of IDTs 206 generate and couple to waves within a propagation region 504 that propagates waves within the specified bandwidth between the reflector 204 and the IDT 310. The second group of IDTs 210 generate and couple to waves within a propagation region 506 that propagates waves within the specified bandwidth between the partial-IDT 308 and the reflector 212.

Figure 6:
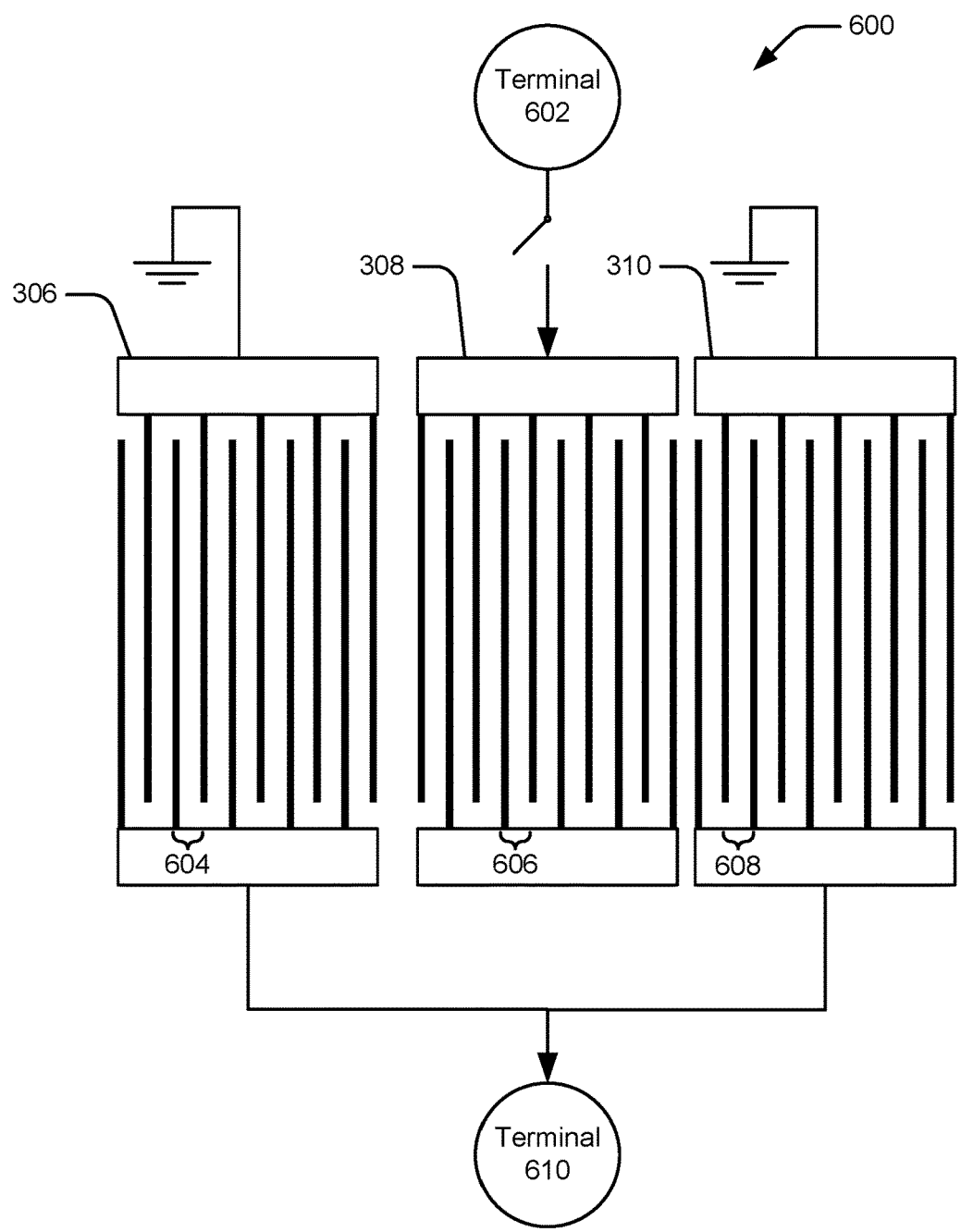
FIG. 6 is an illustration of a partial-IDT between other IDTs according to one or more implementations.
Figure 7:
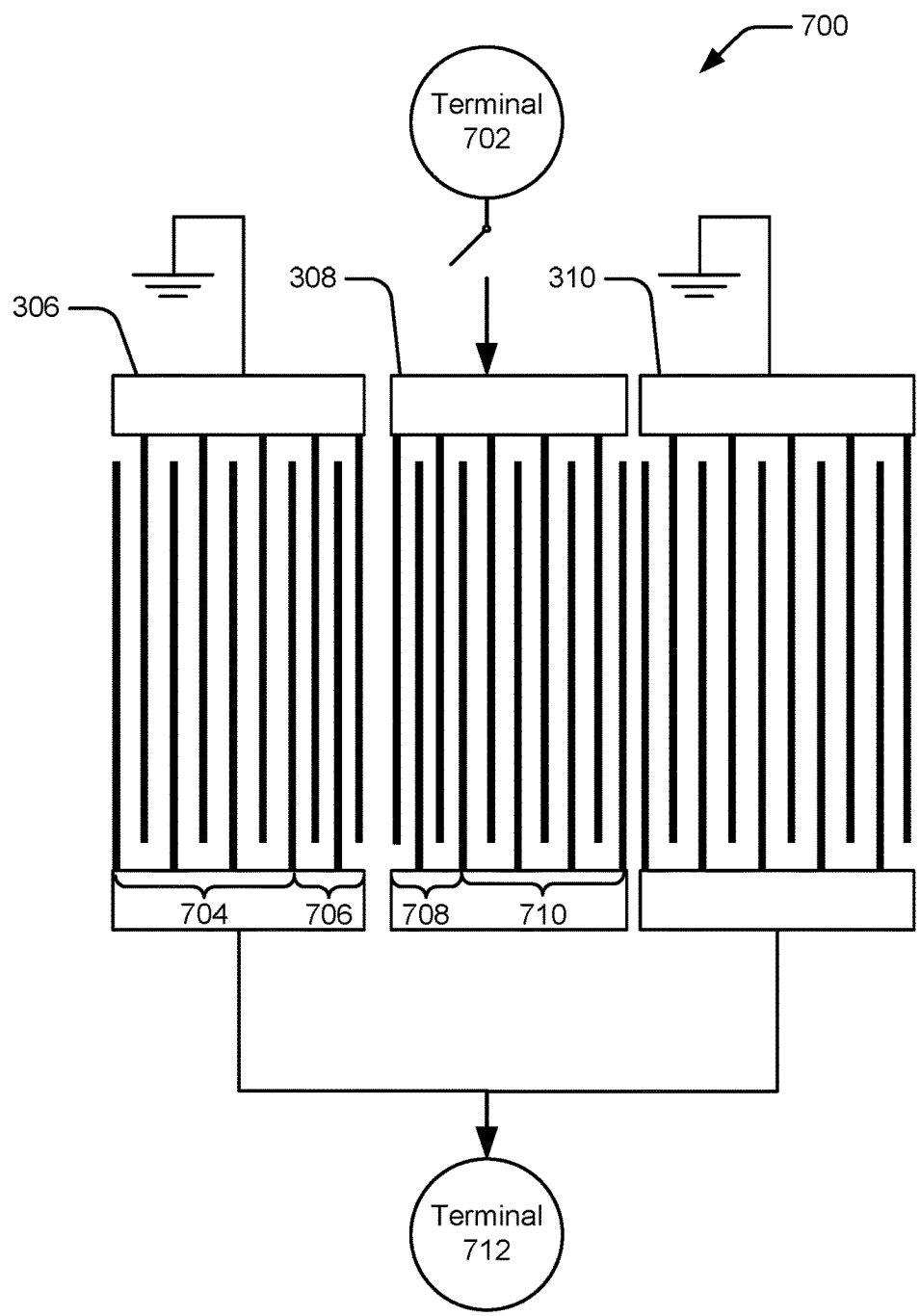
FIG. 7 is an illustration of a partial-IDT between other IDTs according to one or more implementations.
Figure 8:
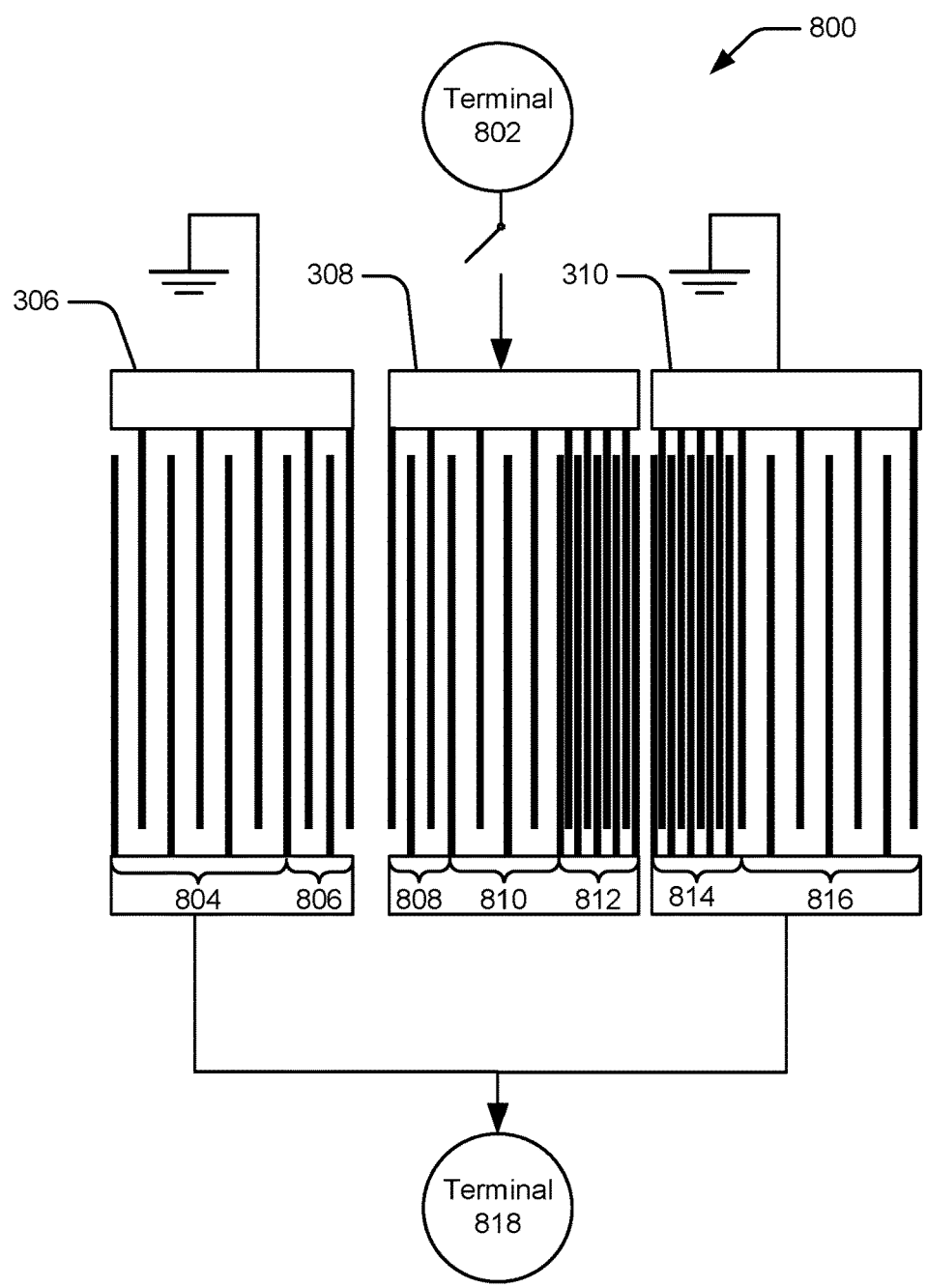
FIG. 8 is an illustration of a partial-IDT between other IDTs according to one or more implementations.

FIGS. 6-8 illustrate various example implementations of the partial-IDT 308 and adjacent IDTs 308 and 310 of the SAW filter 114. The various example implementations depicted in FIGS. 6-8 may be incorporated into a configuration of the SAW filter, such as the configuration 300, which includes additional components. Additionally, the IDTs 306 and 310 are shown as output IDTs; however, the SAW filter 114 may be similarly configured with the IDTs 306 and 310 as input IDTs. Further, the fingers shown in FIGS. 6-8 are representative of many fingers of the IDTs 306 and 310 and the partial-IDT 308. The IDT 306 includes a first quantity of fingers, the partial-IDT 308 includes a second quantity of fingers, and the IDT 310 includes a third quantity of fingers. The first quantity, the second quantity, and the third quantity may all be equal, or substantially equal. Alternatively, only two of the first quantity, the second quantity, and the third quantity are substantially equal. For example, the IDTs 306 and 310 and the partial-IDT 308 each have between about 20 and 50 fingers. In some of these examples, the IDTs 306 and 310 and the partial-IDT 308 each have between 24 and 46 fingers. Further, the IDTs 306 and 310 and the partial-IDT 308 may each have about 24 fingers.

FIG. 6 illustrates a configuration 600 of elements of the SAW filter 114. The configuration 600 shows the IDTs 306 and 310 and the partial-IDT 308 of the configuration 300 of FIG. 3. The partial-IDT may be coupled to a terminal 602 or may be uncoupled from inputs. The terminal 602 may be coupleable to an antenna, a signal generator of a device housing the SAW filter 114, another filter, or may be coupled to an input voltage without a signal wave other than the power supply. The IDT 306 includes fingers arranged at a pitch 604, the partial-IDT 308 includes fingers arranged at a pitch 606, and the IDT 310 includes fingers arranged at a pitch 608. In some implementations, the pitches 604, 606, and 608 are equal or about equal. Additionally or alternatively, one or more of the pitches 604, 606, and 608 are variable across a length of each element. For example, one or more of the IDTs 306 or 310 or the partial-IDT 308 may have multiple regions having respective pitches that are distinct from one or more others of the multiple regions.

The IDTs 306 and 310 are coupled to a terminal 610. The terminal 610 may be coupled to an antenna, a signal generator of a device housing the SAW filter 114, a signal processor of the device housing the SAW filter 114, another filter, or may be coupled to an input voltage without a signal wave other than the power supply. In some implementations, the terminals 602 and 610 are electrically coupled to provide an output signal to the partial-IDT 308. Alternatively, the IDTs 306 and 310 may be configured as input IDTs and an input signal is provided to the partial-IDT 308.

FIG. 7 illustrates a configuration 700 of elements of the SAW filter 114. The configuration 700 shows the IDTs 306 and 310 and the partial-IDT 308 of the configuration 300 of FIG. 3. The partial-IDT 308 may be coupled to a terminal 702, coupled to another voltage source, or may be uncoupled from inputs. The IDTs 306 and 310 are coupled to a terminal 712 either to receive an input signal, or to transmit an output signal to another element or device. In some implementations, the terminals 702 and 712 are electrically coupled to provide an output signal to the partial-IDT 308. Alternatively, the IDTs 306 and 310 may be configured as input IDTs and an input signal is provided to the partial-IDT 308.

The IDT 306 includes a region 704 having a first pitch and a region 706 having a second pitch. In some implementations, one or more of the regions 704 or 706 have a variable pitch. The partial-IDT 308 includes a region 708 having a third pitch and a region 710 having a fourth pitch. In some implementations, one of the regions 704 and 706 have a pitch to either generate, or couple to, waves having a main-resonance frequency, and the other of the regions 704 and 706 have a pitch to facilitate generating, or coupling to, chirp-frequency waves. For example, the region 704 has a pitch to couple to main-resonance-frequency waves and the region 706 is a chirping region including fingers arranged at a pitch to interact with the region 708 to facilitate resonance of chirped-frequency waves. The region 708 is may be another chirping region adjacent to the IDT 306 of the first group of IDTs 206 including fingers arranged at a pitch to facilitate resonance of the chirped-frequency waves between the IDT 306 and the partial-IDT 308. Alternatively, the region 708 is a chirping region including fingers arranged at a pitch to facilitate resonance of waves within the specified passband and the region 710 includes fingers arranged at a pitch to facilitate reflection of waves propagating from or through the IDT 310.

FIG. 8 illustrates a configuration 800 of elements of the SAW filter 114. The configuration 800 shows the IDTs 306 and 310 and the partial-IDT 308 of the configuration 300 of FIG. 3. The partial-IDT 308 may be coupled to a terminal 802, or may be uncoupled from any input. The IDTs 306 and 310 are coupled to a terminal 818 either to receive an input signal, or to transmit an output signal to another element or device. In some implementations, the terminals 802 and 818 are electrically coupled to provide an output signal to the partial-IDT 308. Alternatively, the IDTs 306 and 310 may be configured as input IDTs and an input signal is provided to the partial-IDT 308.

The IDT 306 includes a region 804 and a region 806, each having a different pitch. The partial-IDT 308 includes a region, 808, another region 810, and yet another region 812, each having a respective pitch. The IDT 310 includes a region 814 and another region 816. In some implementations, the region 804 is configured with a pitch to receive, or couple to, waves having a frequency within the specified passband and the regions 806 and 808 are configured to facilitated resonance of a chirped-frequency wave. The region 810 may be configured to facilitate resonance of main-resonance acoustic waves of the first group of IDTs (including the IDT 306), and the regions 812 and 814 may be configured to facilitate a reflector transition between the partial-IDT 308 and the IDT 310. The region 816 may also be configured with a pitch to receive, or couple to, waves having a frequency within the specified passband.

The regions 808, 810, and 812 may be various in length and in quantity of fingers. For example, the region 808 may include about 40% of the fingers of the partial-IDT 308, the region 810 may include about 25% of the fingers of the partial-IDT 308, and the region 812 may include about 35% of the fingers of the partial-IDT 308. Alternatively, the regions 808 and 812 have about a same length or a same quantity of fingers. Furthermore, the region 812 may have a pitch that is less than $\lambda/4$, where $\lambda$ is a wavelength of the main-resonance acoustic wave. The regions 804 and 810 may have a pitch that is about $\lambda/2$ and the regions 806 and 808 vary slightly from $\lambda/2$.

Figure 9:
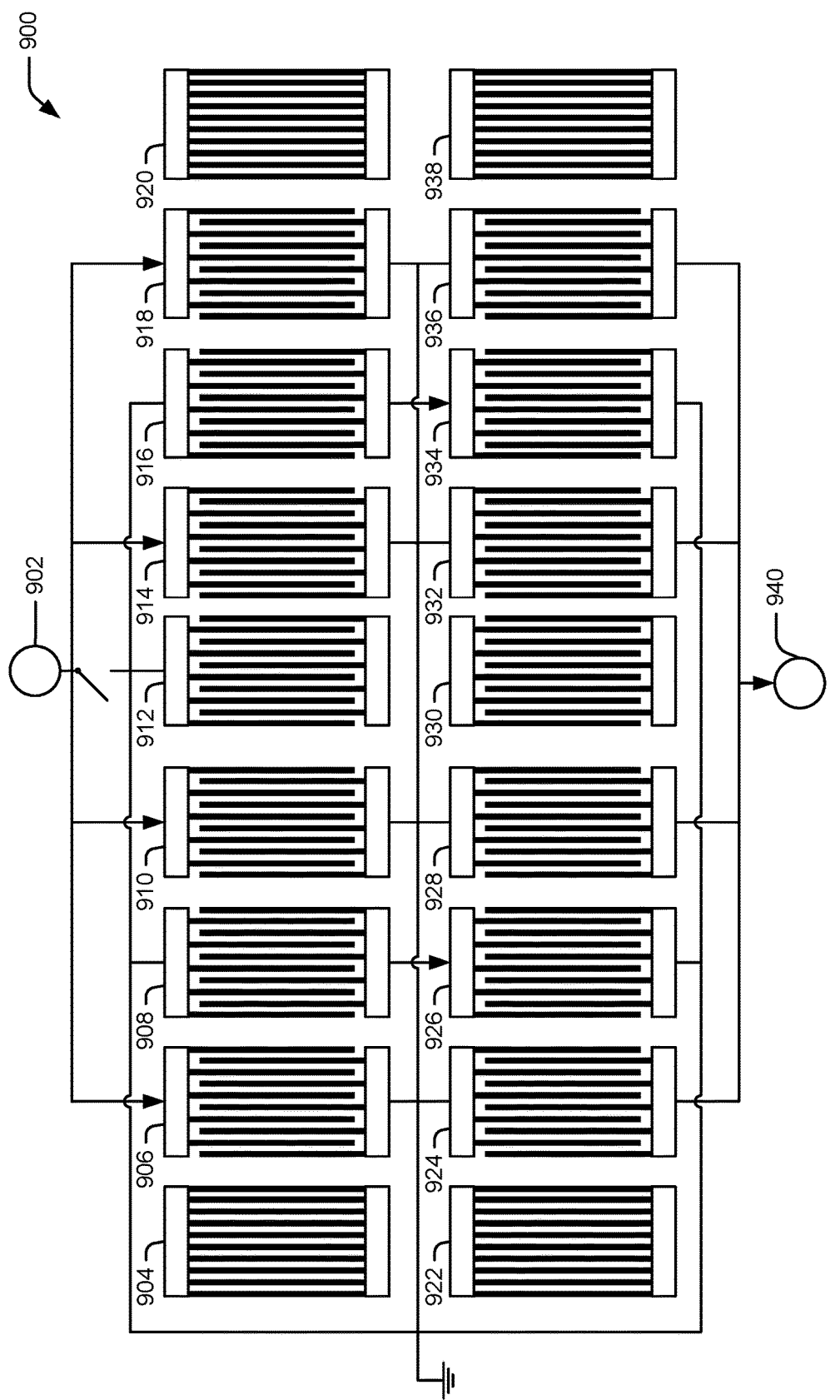
FIG. 9 is an illustration of a two-track, 6-IDT SAW filter according to one or more implementations.

FIG. 9 illustrates a two-track, 6-IDT SAW filter 900. The filter 900 is coupled to a terminal 902, which may be an input terminal or an output terminal as described herein. A first track of the filter 900 includes a reflector 904; a first group of IDTs 906, 908, and 910; a partial-IDT 912; a second group of IDTs 914, 916, and 918; and a reflector 920. The partial-IDT 912 may be configured with a cavity transition on a first side and a reflector transition on the other side. The configuration of the partial-IDT 912 may include a distance between the partial-IDT 912 and an adjacent IDT and/or a chirped region of the partial-IDT. The partial-IDT may be configured with a cavity transition on a side adjacent to the first group of IDTs 906, 908, and 910 and a reflector transition on a side adjacent to the second group of IDTs 914, 916, and 918. Alternatively, the partial-IDT may be configured with a reflector transition on a side adjacent to the first group of IDTs 906, 908, and 910 and a cavity transition on a side adjacent to the second group of IDTs 914, 916, and 918. The partial-IDT may also be configured with a chirped region for facilitating a resonance of a chirped-frequency wave with an adjacent IDT.

In an example implementation, the terminal 902 is an input terminal and the partial-IDT 912 has a cavity transition on a side adjacent to the first group of IDTs 906, 908, and 910 and a reflector transition on a side adjacent to the second group of IDTs 914, 916, and 918. In this example implementation, an electrical input signal is received by the IDTs 906, 910, 914, and 918 via the terminal 902. The electrical input signal is then transformed into an acoustic signal and propagated in a longitudinal direction. The acoustic signal is contained within the first track by the reflectors 904 and 920. The leaking of the acoustic signal from the first group of IDTs 906, 908, and 910 to the second group of IDTs 914, 916, and 918 is reduced by the reflector transition between the partial-IDT 912 and the IDT 914. A portion of the acoustic signal having a frequency within a specified passband is received by the IDTs 908 and 916 and transformed into an output electrical signal. The output electrical signal of the first track is then used as an input electrical signal for a second track of the filter 900.

A second track of the filter 900 includes a reflector 922; a first group of IDTs 924, 926, and 928; a partial-IDT 930; a second group of IDTs 932, 934, and 936; and a reflector 938. Similar to the partial-IDT 912, the partial-IDT 930 may be configured with a cavity transition on a first side and a reflector transition on the other side. The partial-IDT 930 may also be configured with a chirped region for facilitating a resonance of a chirped-frequency wave with an adjacent IDT.

Following the example implementation above, where the terminal 902 is an input terminal, the IDTs 926 and 934 receive an input electrical signal as an output electrical signal of the first track of the filter 900. The electrical input signal is then transformed into an acoustic signal and propagated in a longitudinal direction. The acoustic signal is contained within the second track by the reflectors 922 and 938. The leaking of the acoustic signal from the first group of IDTs 924, 926, and 928 to the second group of IDTs 932, 934, and 936 is reduced by the reflector transition between the partial-IDT 930 and an adjacent IDT. The second track performs a second filtering process as a portion of the acoustic signal having a frequency within a specified passband is received by the IDTs 924, 928, 932, and 936 and transformed into an output electrical signal. The output electrical signal of the second track is then delivered to another component of a device housing the filter 900 via a terminal 940.

One or both of the partial-IDTs 912 and 930 may be coupled to an input. Additionally or alternatively, the partial-IDTs 912 and 930 may be coupled to an input voltage that does not include the input signal as provided to the IDTs 906, 910, 914, 918, 926, or 934. In other implementations, one of the partial-IDTs 912 and 930 are replaced with a reflector.

Figure 10:
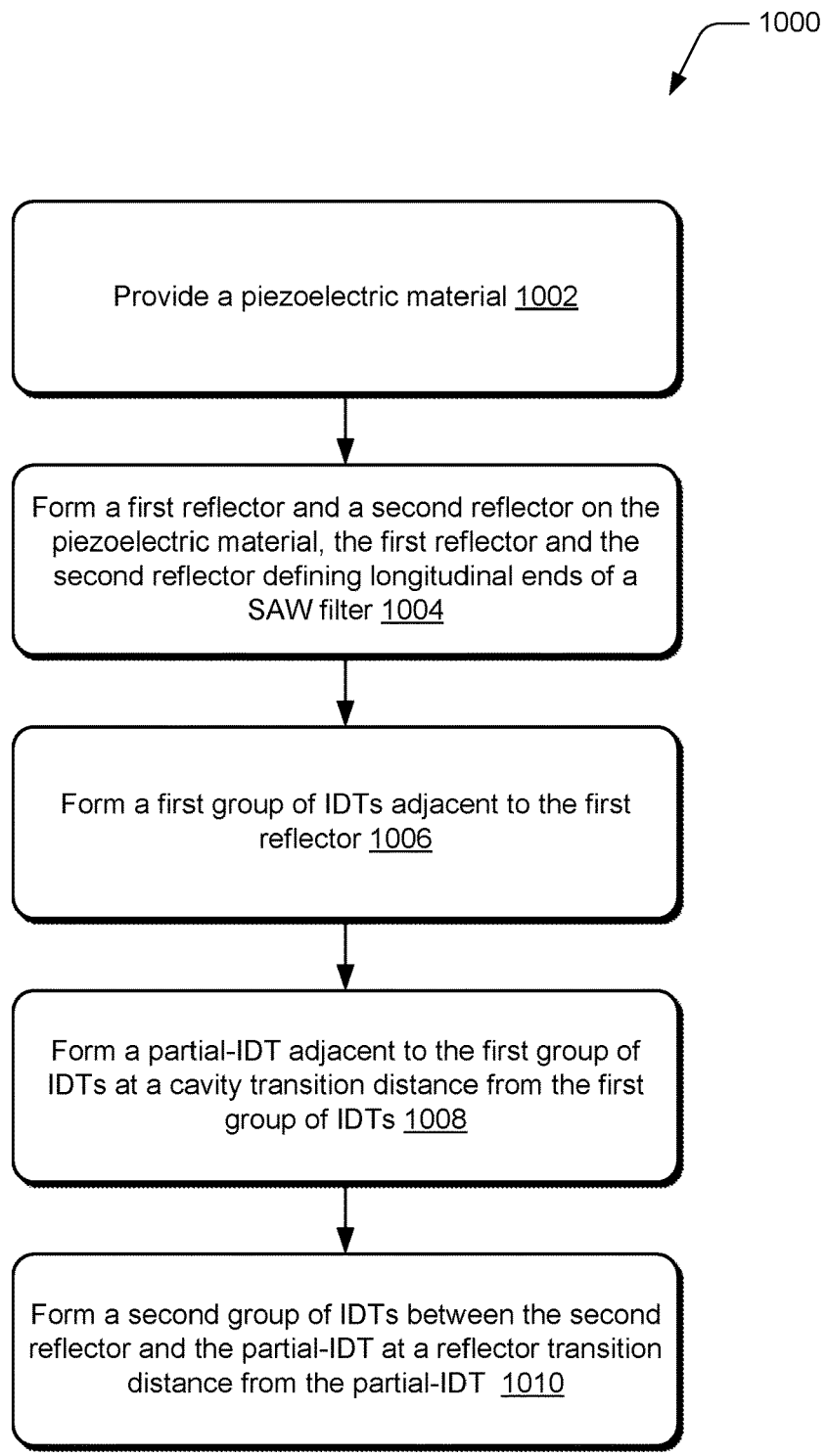
FIG. 10 is a flow diagram that describes operations for forming a SAW filter according to one or more implementations.

FIG. 10 is a flow diagram describing operations for providing a SAW filter as described herein. At operation 1002, a piezoelectric material is provided. The piezoelectric material may include aluminum nitride, quartz crystal, gallium orthophosphate, or lithium-based material. Furthermore, the piezoelectric material may be doped, sized, and/or cut at various angles to modify propagation, coupling, or other material characteristics.

At operation 1004, a first reflector and a second reflector are formed on the piezoelectric material to define longitudinal ends of the SAW filter. For example, the reflectors 204 and 212 define longitudinal ends of the SAW filter 114 as shown in FIG. 2. The reflector is tuned to have a pitch calibrated for reflecting acoustic waves that are within a specified passband. To calibrate a pitch of the reflectors, a range of wavelengths is determined for waves having a frequency within the passband. To determine the range of wavelengths, the range of frequencies within the passband is divided by a speed of the wave in the piezoelectric material. For example, if a passband has a range of 729 MHz to 746 MHz, and a velocity of acoustic waves in the piezoelectric material is 5760 m/s, then the range of wavelengths ($\lambda$) is $$\left(\frac{5760\frac{m}{s}}{746 \text{ MHz}}, \frac{5760\frac{m}{s}}{729 \text{ MHz}}\right)$$

or $(7.72\times10^{-6}$ m, $7.90\times10^{-6}$ m). The pitch of the reflectors may be calibrated to about $\lambda/2$ for $\lambda$: $(7.72\times10^{-6}$ m, $7.90\times10^{-6}$ m) to perform reflection of waves within the passband.

At operation 1006, a first group of IDTs is formed adjacent to the first reflector. For example, the first group of IDTs 206 are formed adjacent to the reflector 204 of the SAW filter 114. The first group of IDTs may be formed by depositing a layer of electrode material on an upper surface of the piezoelectric material using, for example MEMS techniques. Additionally or alternatively, the first group of IDTs may be formed by etching into the piezoelectric material such that elements of the first group of IDTs are formed having a portion of piezoelectric material between them.

At operation 1008, a partial-IDT is formed adjacent to the first group of IDTs at a cavity distance from the first group of IDTs. For example, the partial-IDT 208 is formed adjacent to the first group of IDTs 206 at a cavity distance from the first group of IDTs 206 to form a cavity transition 214. As discussed above, the cavity distance may be, for example, between $n\times\lambda+\lambda/4$ and $n\times\lambda+\lambda/2$, where $\lambda$ is a wavelength of a main-resonance acoustic wave generated by the first group of IDTs and n is a whole number. In some of these examples, the cavity distance may be between $0.3\times\lambda$ and $0.4\times\lambda$. More specifically, the cavity distance may be about $0.32\times\lambda$.

At operation 1010, a second group of IDTs is formed between the second reflector and the partial-IDT at a reflector distance from the partial-IDT. For example, the second group of IDTs 210 is formed between the reflector 212 and the partial-IDT 208 to facilitate a reflector transition 216 with the partial-IDT 208. As discussed above, the reflector distance may be, for example, between $n\times\lambda$ and $n\times\lambda+\lambda/4$, where $\lambda$ is a wavelength of a main-resonance acoustic wave generated by the first group of IDTs and n is a whole number. In some of these examples, the reflector distance may be between $0.05\times\lambda$ and $0.15\times\lambda$. More specifically, the reflector distance may be about $0.09\times\lambda$.

Figure 11:
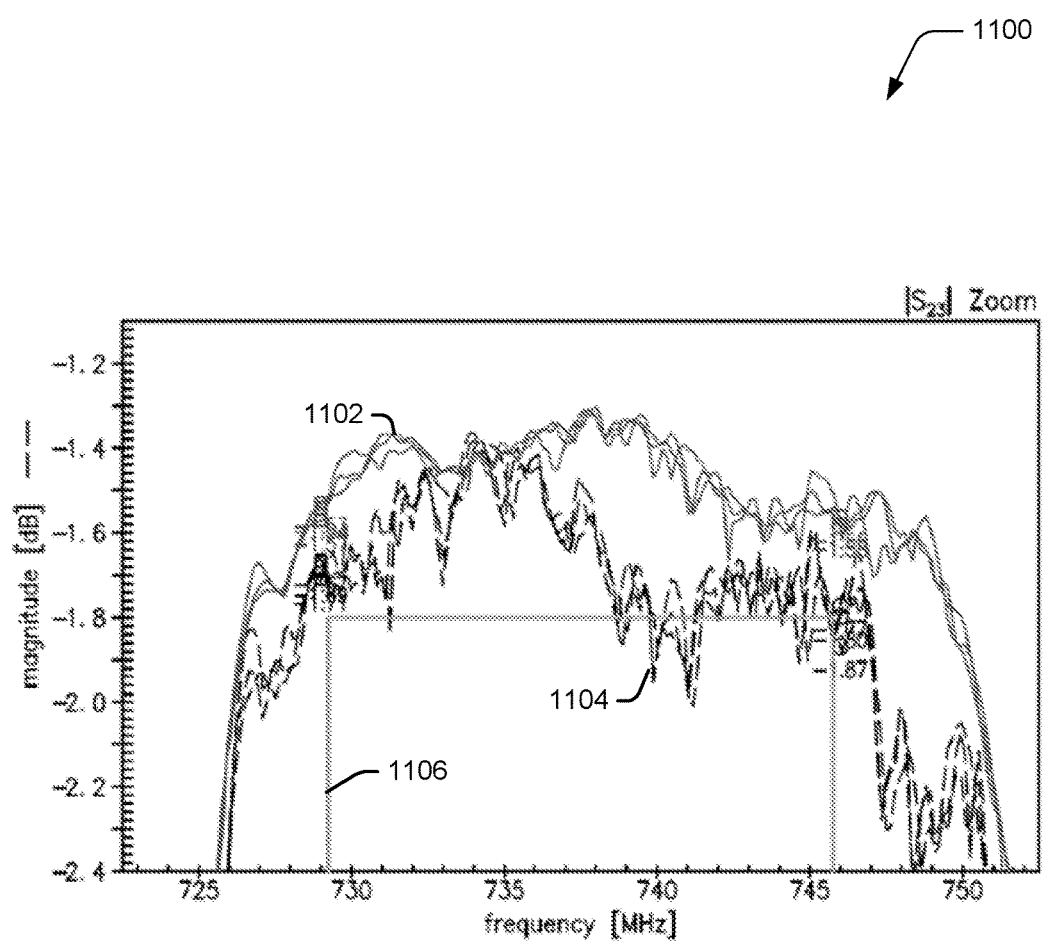
FIG. 11 illustrates measured outputs of two-track, 6-IDT SAW filters comparing implementations of disclosed techniques and a conventional 6-IDT SAW filter.

FIG. 11 illustrates a measured output of a SAW filter, according to implementations described herein. A collection 1102 of solid curves indicates amplitudes of output signals at various frequencies resulting from testing a two-track 6-IDT SAW filter having a partial-IDT between a first group of IDTs and a second group of IDTs for one track of the filter, such as the filter 900. A collection 1104 of dashed curves indicates amplitudes of output signals at various frequencies resulting from testing a conventional two-track 6-IDT SAW filter having a reflector between a first group of IDTs and a second group of IDTs for each track of the filter. The amplitude is inversely proportional to energy loss between an input signal and an output signal of the measured filter. Thus, a higher amplitude indicates a reduction in energy loss. A quality factor of the filter is based on a magnitude of a slope of the curve outside of a specified passband 1106. Thus, the measured output of the solid curve 1102 and the dashed curve 1104 indicates that the two-track 6-IDT SAW filter having a partial-IDT between a first group of IDTs and a second group of IDTs for one track of the filter, such as the filter 900 has a decreased energy loss and an increased quality factor over conventional filters.

CONCLUSION

Although the implementations have been described in language specific to structural features and/or methodological acts, it is to be understood that the implementations defined in the appended claims are not necessarily limited to the specific features or acts described. Rather, the specific features and acts are disclosed as example forms of implementing the claimed implementations.

What is claimed is:

1. A surface acoustic wave (SAW) filter comprising:
 a piezoelectric material;
 a first group of inter-digital transducers (IDTs) on the piezoelectric material, the first group of IDTs configured to:
  transform a first set of electrical signals into a first set of acoustic signals for propagation via a first portion of the piezoelectric material;
  select a first set of selected acoustic signals of the first set of acoustic signals within a specified passband; and
  convert the first set of selected acoustic signals into a first set of filtered electrical signals;
 a second group of IDTs on the piezoelectric material, the second group of IDTs configured to:
  transform a second set of electrical signals into a second set of acoustic signals for propagation via a second portion of the piezoelectric material;
  select a second set of selected acoustic signals of the second set of acoustic signals within the specified passband; and
  convert the second set of selected acoustic signals into a second set of filtered electrical signals; and
 a partial-IDT on the piezoelectric material and positioned between the first group of IDTs and the second group of IDTs, the partial-IDT including:
  a first bus bar and a second bus bar, the first bus bar and the second bus bar uncoupled from ground such that the partial-IDT is electrically floating;
  a first side configured to facilitate a cavity transition between the partial-IDT and the first group of IDTs, the cavity transition configured to facilitate propagation of the first set of acoustic signals within, or between elements of, the partial-IDT; and
  a second side configured to facilitate a reflector transition between the partial-IDT and the second group of IDTs, the reflector transition configured to reduce propagation of the second set of acoustic signals within, or between elements of, the partial-IDT.

2. The SAW filter of claim 1, wherein at least one of the first bus bar or the second bus bar is coupled to an input terminal.

3. The SAW filter of claim 1, wherein the partial-IDT includes a chirping region adjacent to the first group of IDTs, the chirping region including fingers arranged at a pitch to facilitate resonance of chirped-frequency waves between the partial-IDT and the first group of IDTs.

4. The SAW filter of claim 3, wherein:
 the first group of IDTs includes an output IDT adjacent to the partial-IDT; and
 the output IDT includes another chirping region that includes other fingers arranged at another pitch to interact with the chirping region of the partial-IDT to facilitate the resonance of chirped-frequency waves.

5. The SAW filter of claim 1, wherein the first group of IDTs includes a first IDT coupled to a first terminal, a second IDT coupled to a second terminal, and a third IDT coupled to the second terminal.

6. The SAW filter of claim 1, wherein the first group of IDTs and the second group of IDTs are coupled to a same input terminal.

7. The SAW filter of claim 6, wherein the first group of IDTs and the second group of IDTs are coupled to the same input terminal such that the first set of acoustic signals is configured to be generated in-phase with the second set of acoustic signals.

8. The SAW filter of claim 1, further comprising a third group of IDTs and a fourth group of IDTs, wherein:
 an input IDT of the third group of IDTs is coupled to an output IDT of the first group of IDTs; and
 an input IDT of the fourth group of IDTs is coupled to an output IDT of the second group of IDTs.

9. The SAW filter of claim 8, wherein:
 an input IDT of the first group of IDTs is coupled to an input IDT of the second group of IDTs; and
 an output IDT of the third group of IDTs is coupled to an output IDT of the fourth group of IDTs.

10. The SAW filter of claim 1, wherein the SAW filter is configured to facilitate the reflector transition by providing the second group of IDTs at a reflector distance from the second side of the partial-IDT, the reflector distance being between $n \times \lambda$ and $n \times \lambda + \lambda/4$, where $\lambda$ comprises a wavelength of a main-resonance acoustic wave of the second group of IDTs and $n$ is a whole number.

11. The SAW filter of claim 1, further comprising:
 a first reflector on the piezoelectric material and adjacent to the first group of IDTs such that the first group of IDTs is between the first reflector and the partial-IDT; and
 a second reflector on the piezoelectric material and adjacent to the second group of IDTs such that the second group of IDTs is between the second reflector and the partial-IDT.

12. A surface acoustic wave (SAW) filter having a first longitudinal end and a second longitudinal end, the SAW filter comprising:
 a piezoelectric material;
 a first reflector on the piezoelectric material and at the first longitudinal end, the first reflector configured to reflect acoustic waves within the SAW filter;
 a first group of inter-digital transducers (IDTs) on the piezoelectric material and adjacent to the first reflector, the first group of IDTs including:
  a first input IDT coupled to an input terminal, the first input IDT configured to receive a first input electric signal and propagate a first set of acoustic signals via a first portion of the piezoelectric material; and
  a first output IDT coupled to an output terminal, the first output IDT configured to receive at least a portion of the first set of acoustic signals and propagate a first output electric signal to the output terminal;
 a partial-IDT on the piezoelectric material and adjacent to the first group of IDTs, the partial-IDT:
  configured to electrically float on the piezoelectric material;
  including a first bus bar and a second bus bar, at least one of the first bus bar or the second bus bar being uncoupled from ground;
  spaced from the first group of IDTs at a cavity distance configured to facilitate propagation of the first set of acoustic signals from the first group of IDTs within, or between elements of, the partial-IDT;
 a second group of IDTs on the piezoelectric material and adjacent to the partial-IDT, the second group of IDTs:
  including a second input IDT coupled to the input terminal, the second input IDT configured to receive a second input electric signal and propagate a second set of acoustic signals via a second portion of the piezoelectric material;

including a second output IDT coupled to the output terminal, the second output IDT configured to receive at least a portion of the second set of acoustic signals and propagate a second output electric signal to the output terminal; and
spaced from the partial-IDT at a reflector distance configured to reduce propagation of the second set of acoustic signals from the second group of IDTs within, or between elements of, the partial-IDT; and
a second reflector on the piezoelectric material and at the second longitudinal end, the second reflector adjacent to the second group of IDTs and configured to reflect the second set of acoustic signals toward the second input IDT.

13. The SAW filter of claim 12, wherein the first input IDT and the second input IDT are coupled to the input terminal in an in-phase configuration.

14. The SAW filter of claim 12, wherein at least one IDT of the first group of IDTs includes a respective chirping region configured to also facilitate propagation of the first set of acoustic signals from the first group of IDTs within, or between elements of, the partial-IDT.

15. The SAW filter of claim 14, wherein the at least one IDT of the first group of IDTs includes an IDT adjacent to the partial-IDT.

16. The SAW filter of claim 15, wherein the partial-IDT includes another chirping region configured to interact with the respective chirping region of the IDT adjacent to the partial-IDT to further facilitate propagation of the first set of acoustic signals from the first group of IDTs within, or between elements of, the partial-IDT.

17. The SAW filter of claim 12, wherein:
the partial-IDT includes a chirping region adjacent to the second group of IDTs; and
another chirping region of an adjacent IDT of the second group of IDTs is configured to interact with the chirping region of the partial-IDT to also reduce propagation of the second set of acoustic signals from the second group of IDTs within, or between elements of, the partial-IDT.

18. The SAW filter of claim 12, wherein at least one of the first bus bar or the second bus bar is coupled to the input terminal.

19. The SAW filter of claim 12, wherein both of the first bus bar and the second bus bar are not a virtual ground between the first group of IDTs and the second group of IDTs.

20. The SAW filter of claim 12, wherein the reflector distance is between $n \times \lambda$ and $n \times \lambda + \lambda/4$, where $\lambda$ comprises a wavelength of a main-resonance acoustic wave generated by the second input IDT, and n is a whole number.

21. The SAW filter of claim 12, wherein the cavity distance is between $n \times \lambda + \lambda/4$ and $n \times \lambda + \lambda/2$, where $\lambda$ comprises a wavelength of a main-resonance acoustic wave generated by the first input IDT, and n is a whole number.

22. A surface acoustic wave (SAW) filter comprising:
a piezoelectric material;
a first reflector on the piezoelectric material and a second reflector on the piezoelectric material, the first reflector and the second reflector defining a first longitudinal end of the SAW filter and a second longitudinal end of the SAW filter, respectively;
a series of inter-digital transducers (IDTs) on the piezoelectric material arranged between the first reflector and the second reflector; and
a partial-IDT on the piezoelectric material, the partial-IDT:
configured to electrically float on the piezoelectric material;
positioned between, and defining, a first group of the series of IDTs and a second group of the series of IDTs;
configured to facilitate a cavity transition between the partial-IDT and the first group of the series of IDTs; and
configured to facilitate a reflector transition between the partial-IDT and the second group of the series of IDTs.

23. The SAW filter of claim 22, wherein the partial-IDT includes a bus bar coupling fingers of the partial-IDT to an input terminal.

24. The SAW filter of claim 22, wherein the partial-IDT includes a chirping region configured to facilitate the cavity transition between the partial-IDT and the first group of the series of IDTs.

25. The SAW filter of claim 24, wherein the partial-IDT includes another chirping region configured to facilitate the reflector transition between the partial-IDT and the second group of the series of IDTs.

26. The SAW filter of claim 22, wherein the partial-IDT is positioned at a cavity distance from the first group and configured to facilitate the cavity transition between the partial-IDT and the first group of the series of IDTs, the cavity distance between $n \times \lambda + \lambda/4$ and $n \times \lambda + \lambda/2$, where $\lambda$ comprises a wavelength of a main-resonance acoustic wave of the first group and n is a whole number.

27. The SAW filter of claim 22, wherein the partial-IDT is positioned at a reflector distance from the second group and configured to facilitate the reflector transition between the partial-IDT and the second group of the series of IDTs, the reflector distance between $n \times \lambda$ and $n \times \lambda + \lambda/4$, where $\lambda$ comprises a wavelength of a main-resonance acoustic wave of the second group and n is a whole number.

28. A surface acoustic wave (SAW) filter comprising:
a piezoelectric material;
a first reflector and a second reflector on the piezoelectric material and defining longitudinal ends of the SAW filter;
a first group of inter-digital transducers (IDTs) on the piezoelectric material, the first group of IDTs configured to:
transform a first set of electrical signals into a first set of acoustic signals for propagation via a first portion of the piezoelectric material;
select a first set of selected acoustic signals of the first set of acoustic signals within a specified passband; and
convert the first set of selected acoustic signals into a first set of filtered electrical signals;
a second group of IDTs on the piezoelectric material, the second group of IDTs configured to:
transform a second set of electrical signals into a second set of acoustic signals for propagation via a second portion of the piezoelectric material;
select a second set of selected acoustic signals of the second set of acoustic signals within the specified passband; and
convert the second set of selected acoustic signals into a second set of filtered electrical signals; and
an element for reducing propagation of the first set of acoustic signals within the second portion of the piezoelectric material and reducing propagation of the second set of acoustic signals within the first portion of the piezoelectric material, the element including:

means for providing a cavity transition between the element and the first group of IDTs, the cavity transition effective to facilitate propagation of at least a portion of the first set of acoustic signals through the element; and means for providing a reflector transition between the element and the second group of IDTs, the reflector transition effective to reduce propagation of the second set of acoustic signals through the element.

29. The SAW filter of claim 28, wherein the cavity transition includes a space between the element and the first group of IDTs, the space comprising a distance between ¼ of a wavelength of a main-resonance acoustic wave of the first group of IDTs and ½ of the wavelength of the main-resonance acoustic wave of the first group of IDTs.

30. The SAW filter of claim 28, wherein the reflector transition includes a space between the element and the second group of IDTs, the space comprising a distance less than ¼ of a wavelength of a main-resonance acoustic wave of the second group of IDTs.

* * * * *